US005635316A

United States Patent [19]
Dao

[11] Patent Number: 5,635,316
[45] Date of Patent: Jun. 3, 1997

[54] LAYOUT METHODOLOGY, MASK SET, AND PATTERNING METHOD FOR PHASE-SHIFTING LITHOGRAPHY

[75] Inventor: Giang T. Dao, Fremont, Calif.

[73] Assignee: Intel Corporation, Santa Clara, Calif.

[21] Appl. No.: 542,741

[22] Filed: Oct. 13, 1995

Related U.S. Application Data

[62] Division of Ser. No. 413,405, Mar. 30, 1995, Pat. No. 5,595,843.

[51] Int. Cl.⁶ .................................................. G03F 9/00
[52] U.S. Cl. ............................... 430/5; 430/311; 430/312
[58] Field of Search ................................. 430/5, 311, 312

[56] References Cited

U.S. PATENT DOCUMENTS

| | | |
|---|---|---|
| 4,231,811 | 11/1980 | Somekh et al. . |
| 4,360,586 | 11/1982 | Flanders et al. . |
| 4,869,998 | 9/1989 | Eccles et al. ........................ 430/311 |
| 4,881,257 | 11/1989 | Nakagawa . |
| 4,890,309 | 12/1989 | Smith et al. . |
| 5,045,417 | 9/1991 | Okamoto . |
| 5,049,925 | 9/1991 | Aiton et al. . |
| 5,135,609 | 8/1992 | Pease et al. . |
| 5,187,726 | 2/1993 | White . |
| 5,216,257 | 6/1993 | Brueck et al. . |
| 5,229,255 | 7/1993 | White . |
| 5,250,983 | 10/1993 | Yamamura . |
| 5,300,377 | 4/1994 | Keum . |
| 5,326,659 | 7/1994 | Liu et al. . |
| 5,422,205 | 6/1995 | Inoue et al. ........................ 430/311 |
| 5,424,154 | 6/1995 | Borodovsky ........................ 430/5 |
| 5,472,814 | 12/1995 | Lin ........................................ 430/5 |

FOREIGN PATENT DOCUMENTS

| | | |
|---|---|---|
| 0090924 | 8/1983 | European Pat. Off. . |
| 0395425 | 10/1990 | European Pat. Off. . |
| 0492630 | 7/1992 | European Pat. Off. . |
| 9120018 | 12/1991 | WIPO . |

OTHER PUBLICATIONS

N. Hasegawa, A. Imai, T. Terasawa, T. Tanaka, F. Murai. *The Japan Society of Applied Physics and Related Societies* "Extended Abstracts 29p–ZC–3, Submicron Lithography Using Phase Mask (9): Halftone Phase Shifting Mask" 1991.

K. Nakagawa, N. Ishiwata, Y. Yanagishita, Y. Tabata. *The Japan Society of Applied Physics and Related Societies*, "Extended Abstracts 29p–ZC–2, Phase–Shifting Photolithography Applicable to Real IC Patterns" 1991.

Lin, Burn J. "The Attenuated Phase–Shifting Mask" *Solid State Technology* Jan. 1992.

Andrew R. Neureuther, "Modeling Phase Shifting Masks", Preliminary Version of BACUS Symposium Paper, Dept. of Electrical Engineering and Computer Sciences, University of California Berkeley, CA 94720, Sep. 26, 1990 pp. 1–6 and Figures 1–13.

H. Ohtsuka, K. Abe, T. Onodera, K. Kuwahara. "Conjugate Twin–Shifter For The New Phase Shift Method To High Resolution Lithography", V–LSI R&D Center, OKI Electric Industry Co., Ltd., SPIE vol. 1463 Optical/Laser Microlithography IV (1991) pp. 112–123.

Hideyuki Jinbo & Yoshio Yamashita, "0.2um or Less i–line Lithograpahy by Phase–shifting–mask Technology," Semiconductor Technology Lab., Oki Electric Industry Co., Ltd. 3 pages.

*Primary Examiner*—S. Rosasco
*Attorney, Agent, or Firm*—Blakely, Sokoloff, Taylor & Zafman

[57] ABSTRACT

A device layer layout methodology, and method and apparatus for patterning a photosensitive layer. Device features are placed on lines running in rows and/or columns during layout. The lines and/or columns are extracted from the database to produce a layout of the phase-edge phase shifting layer. The photosensitive layer may be exposed to a mask corresponding to this layout, to produce latent image of the rows and/or lines. The photosensitive layer is also exposed to the device layer layout to expose unwanted portions of the phase-edge layer. Methods of forming a variety of device features, including contact/via openings and contact/via plugs are disclosed.

11 Claims, 9 Drawing Sheets

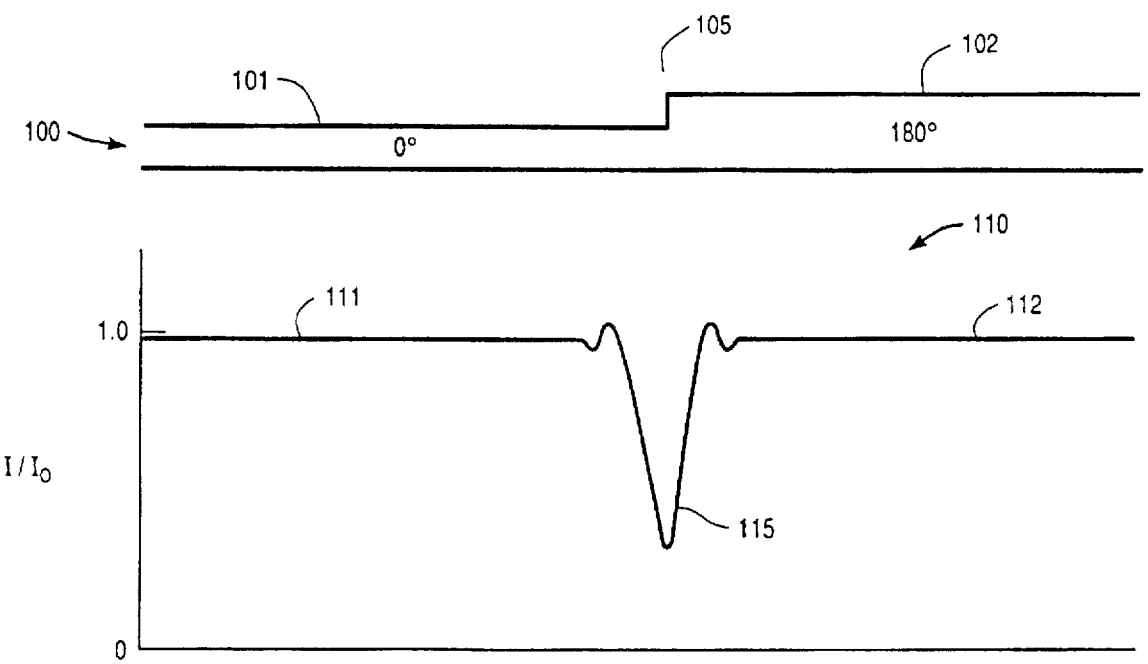
FIG_1
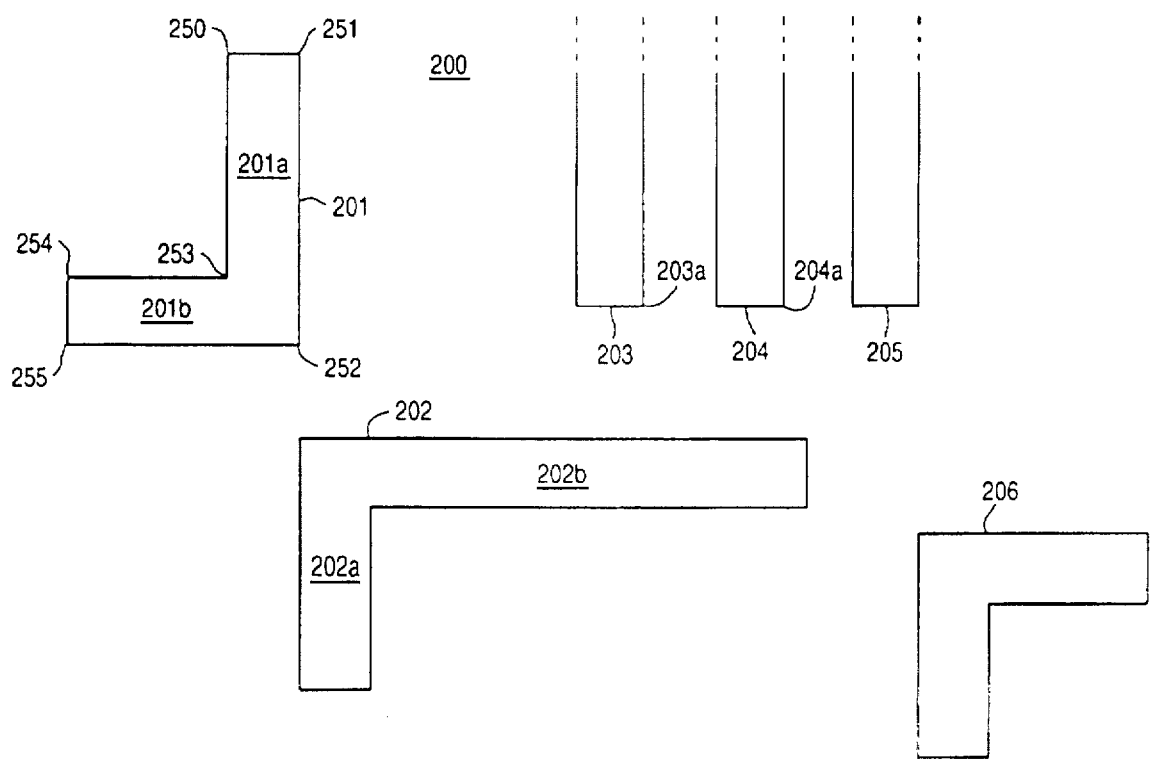
FIG_2 (PRIOR ART)

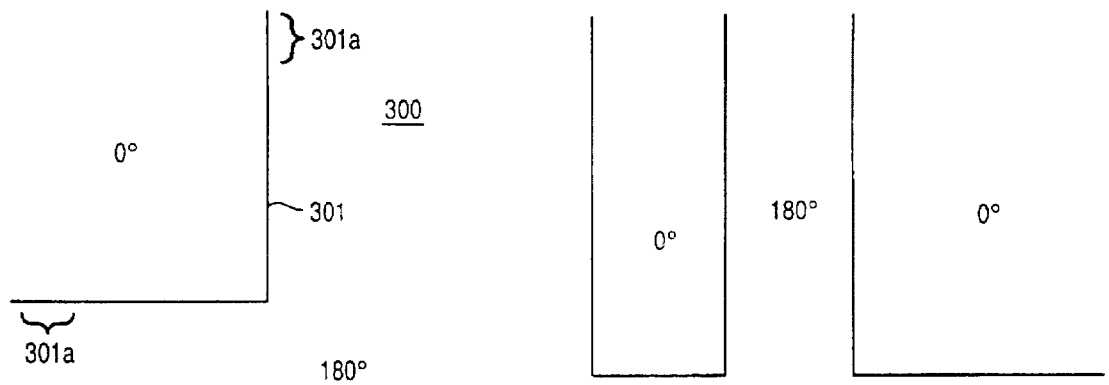
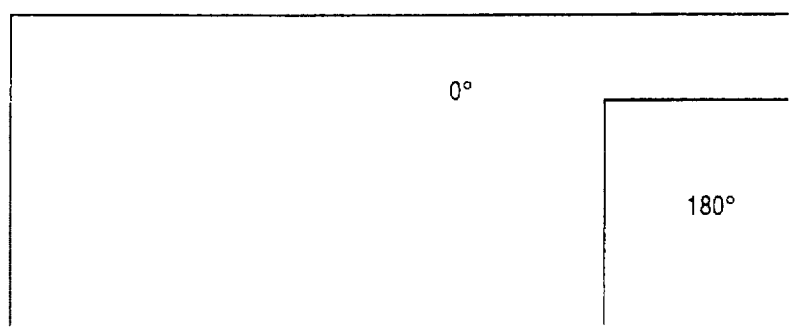
FIG_3
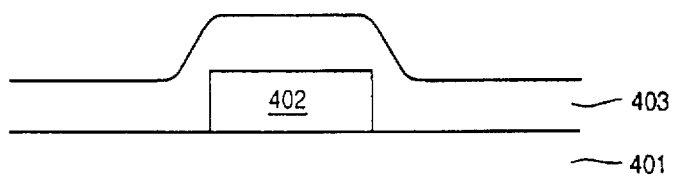
FIG_4A
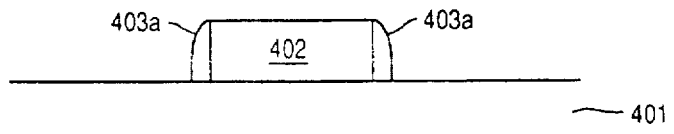
FIG_4B
FIG_4C

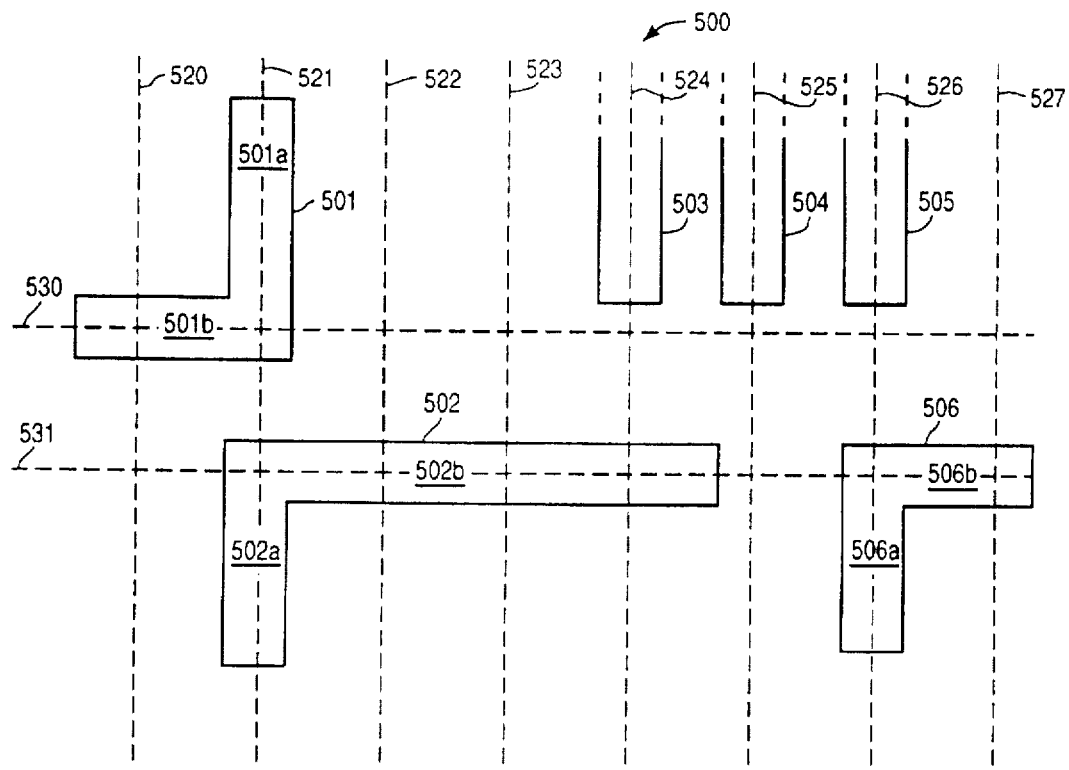
FIG_5
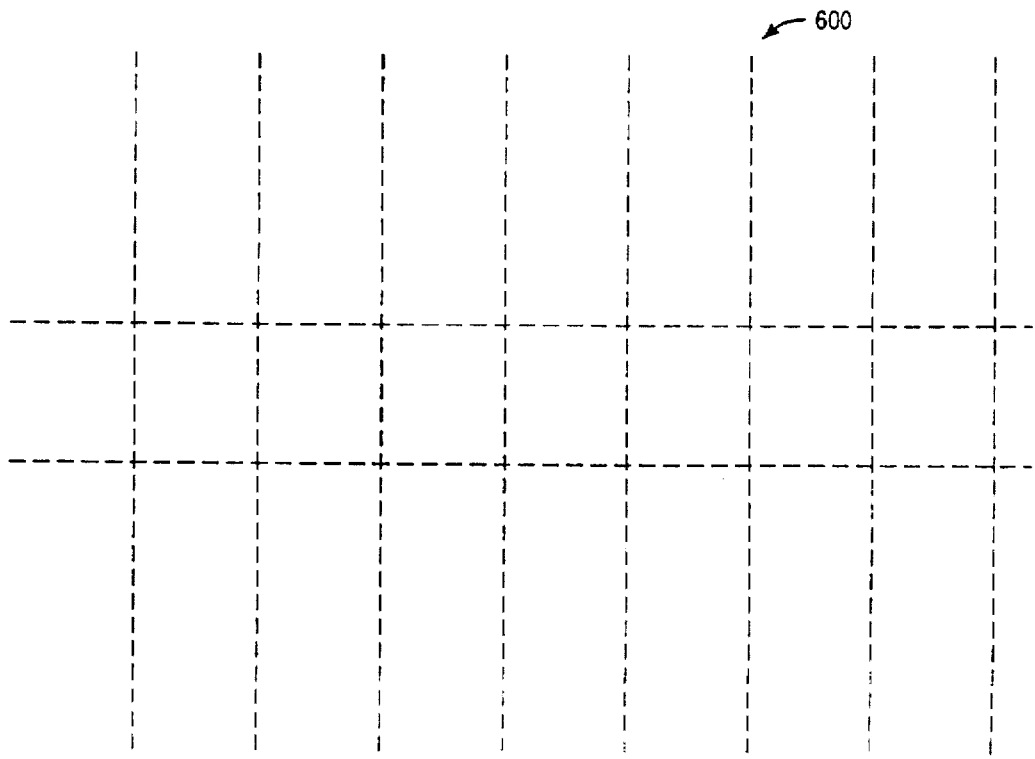
FIG_6

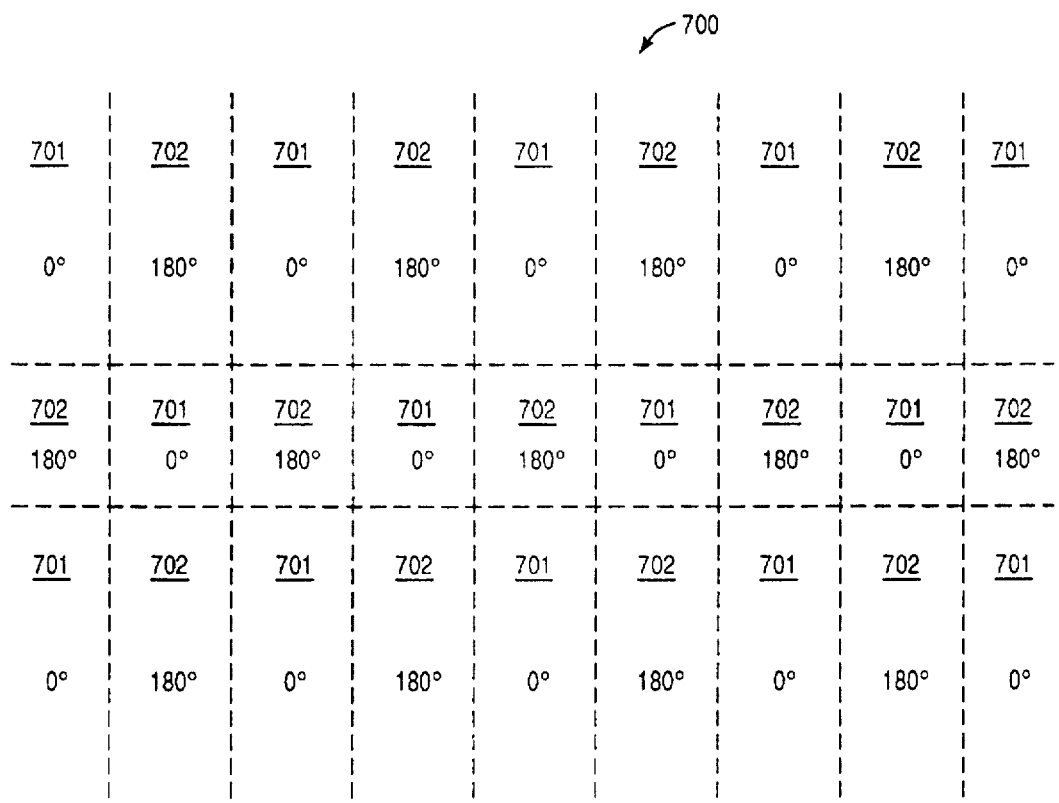
FIG_7
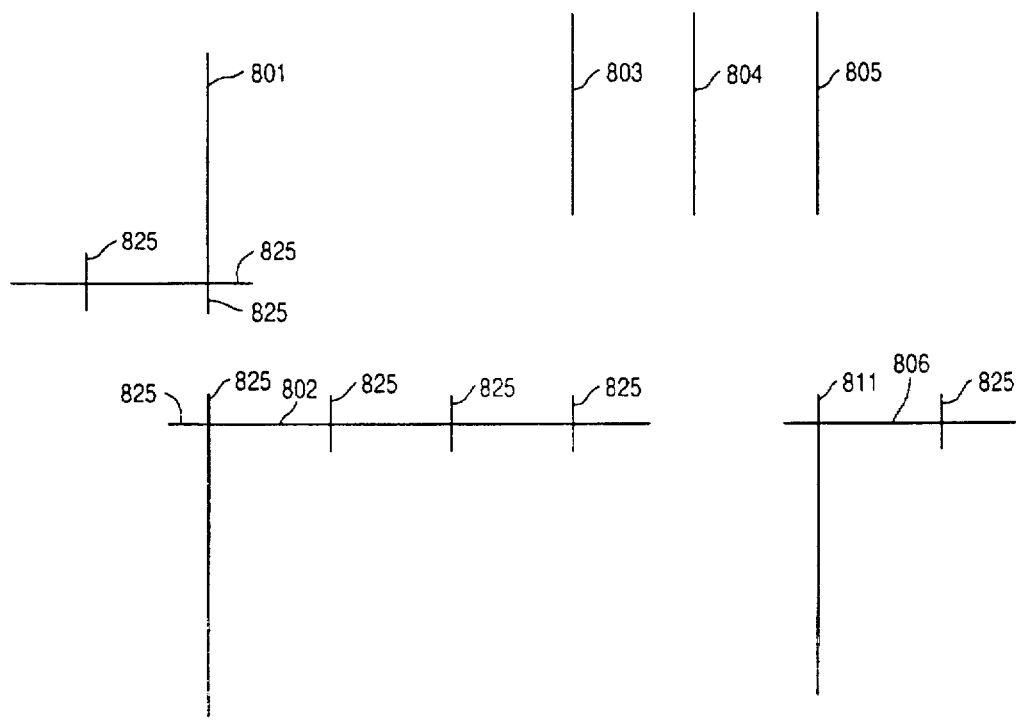
FIG_8

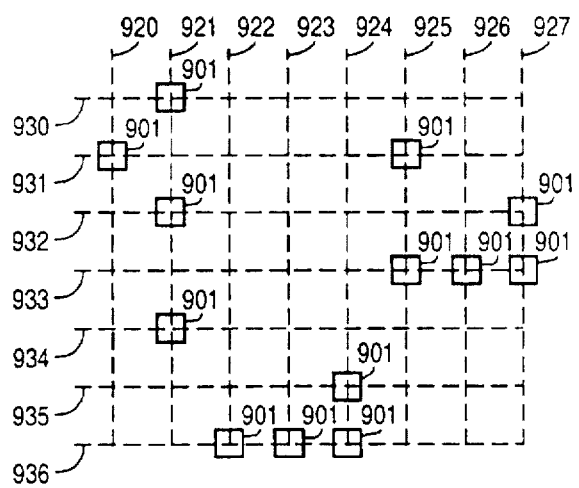
FIG_9
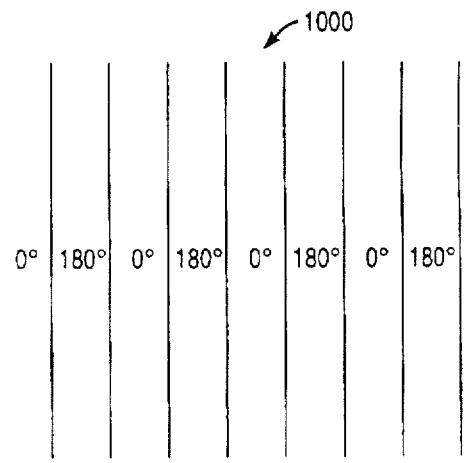
FIG_10
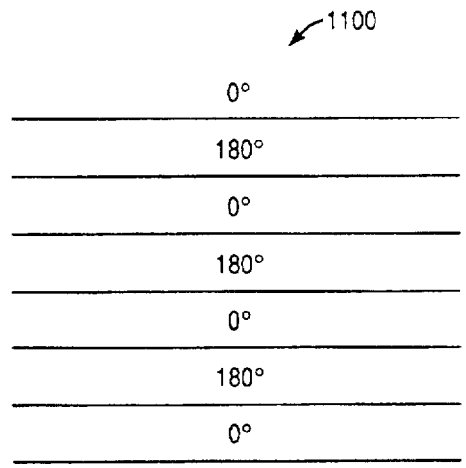
FIG_11
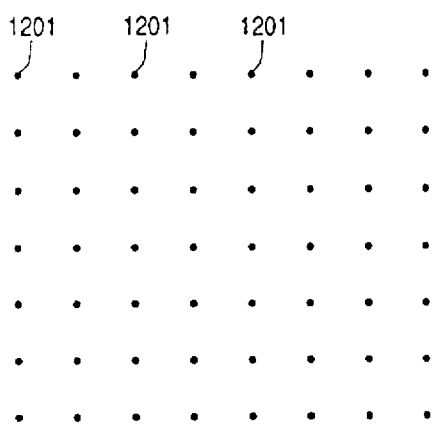
FIG_12
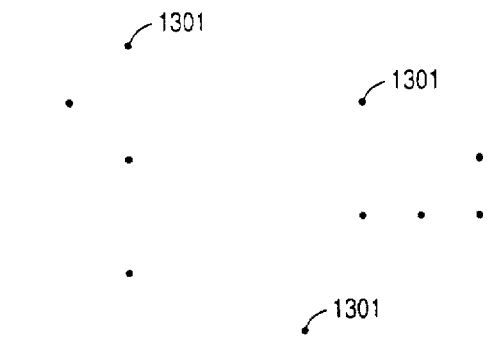
FIG_13

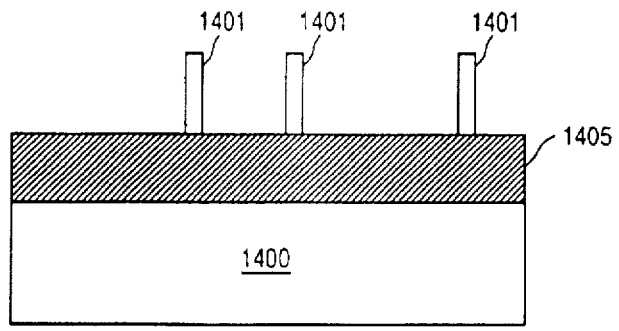
FIG_14A
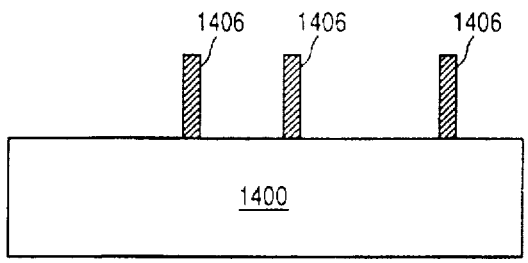
FIG_14B
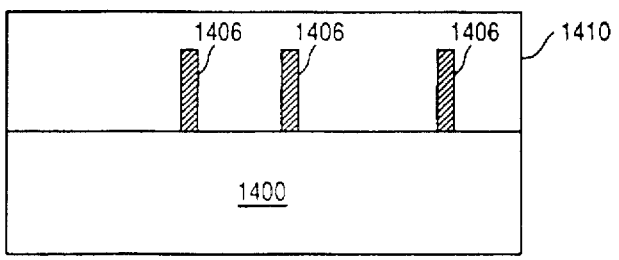
FIG_14C
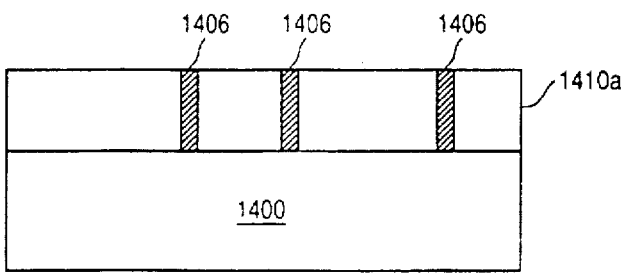
FIG_14D

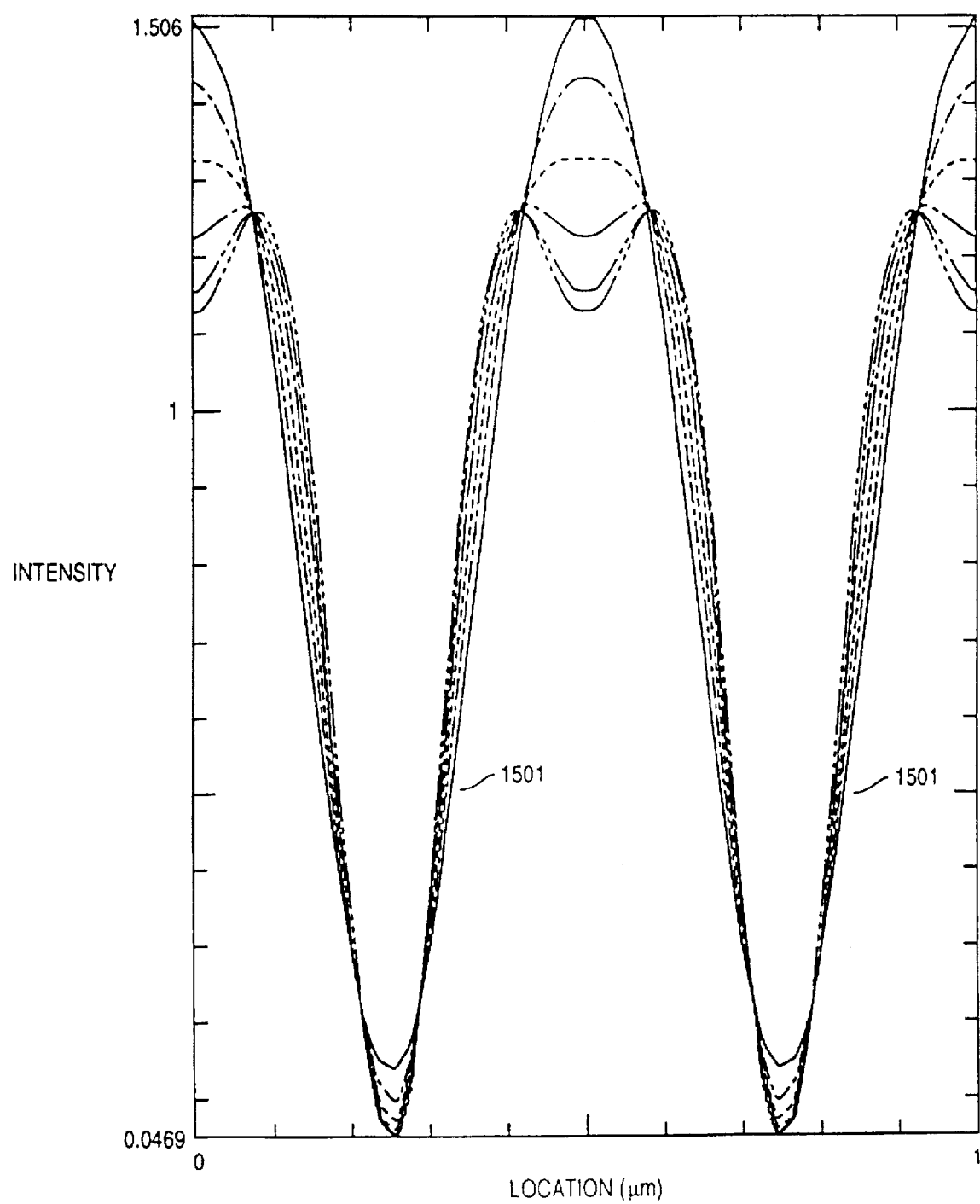
FIG_15

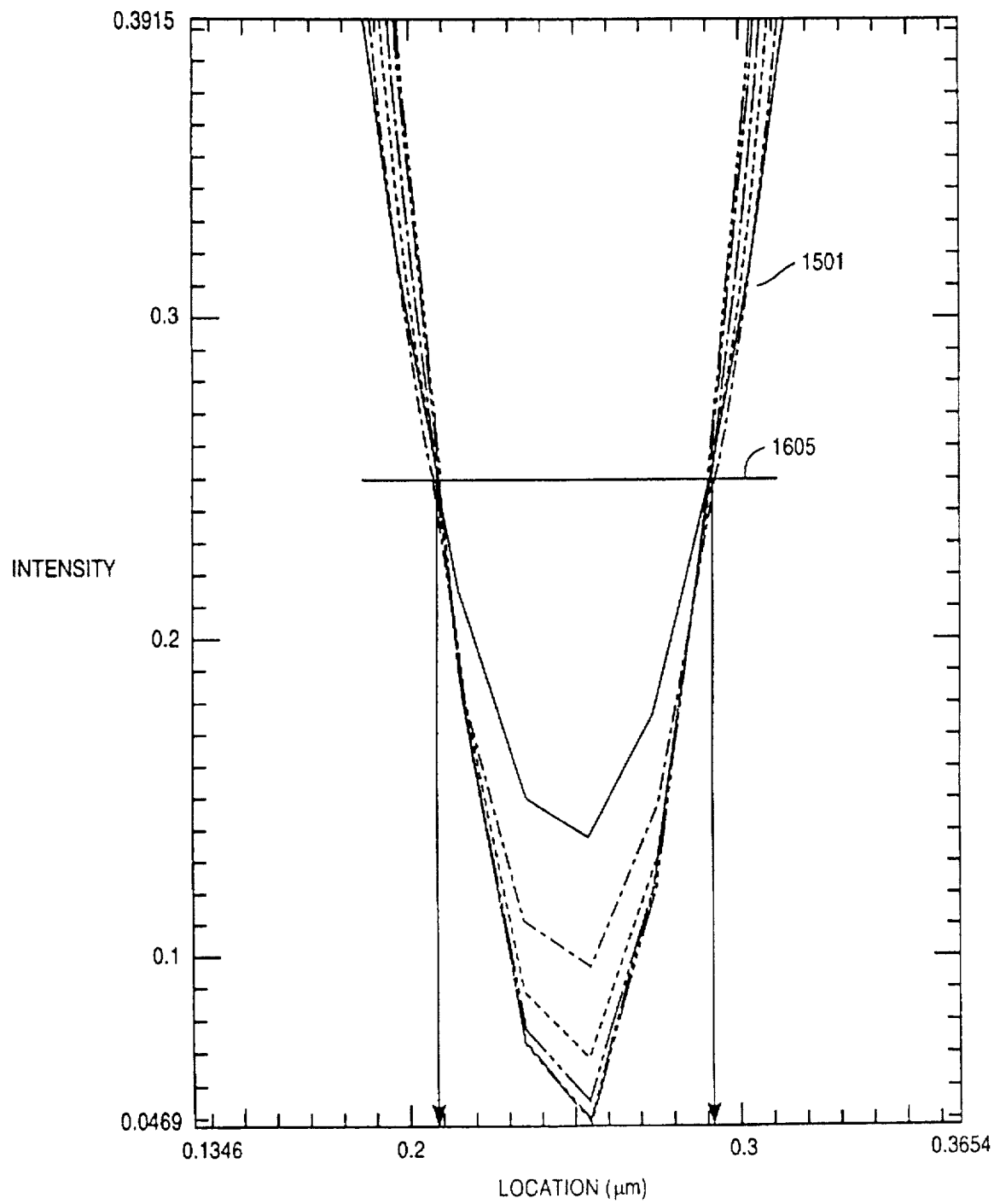
FIG_16

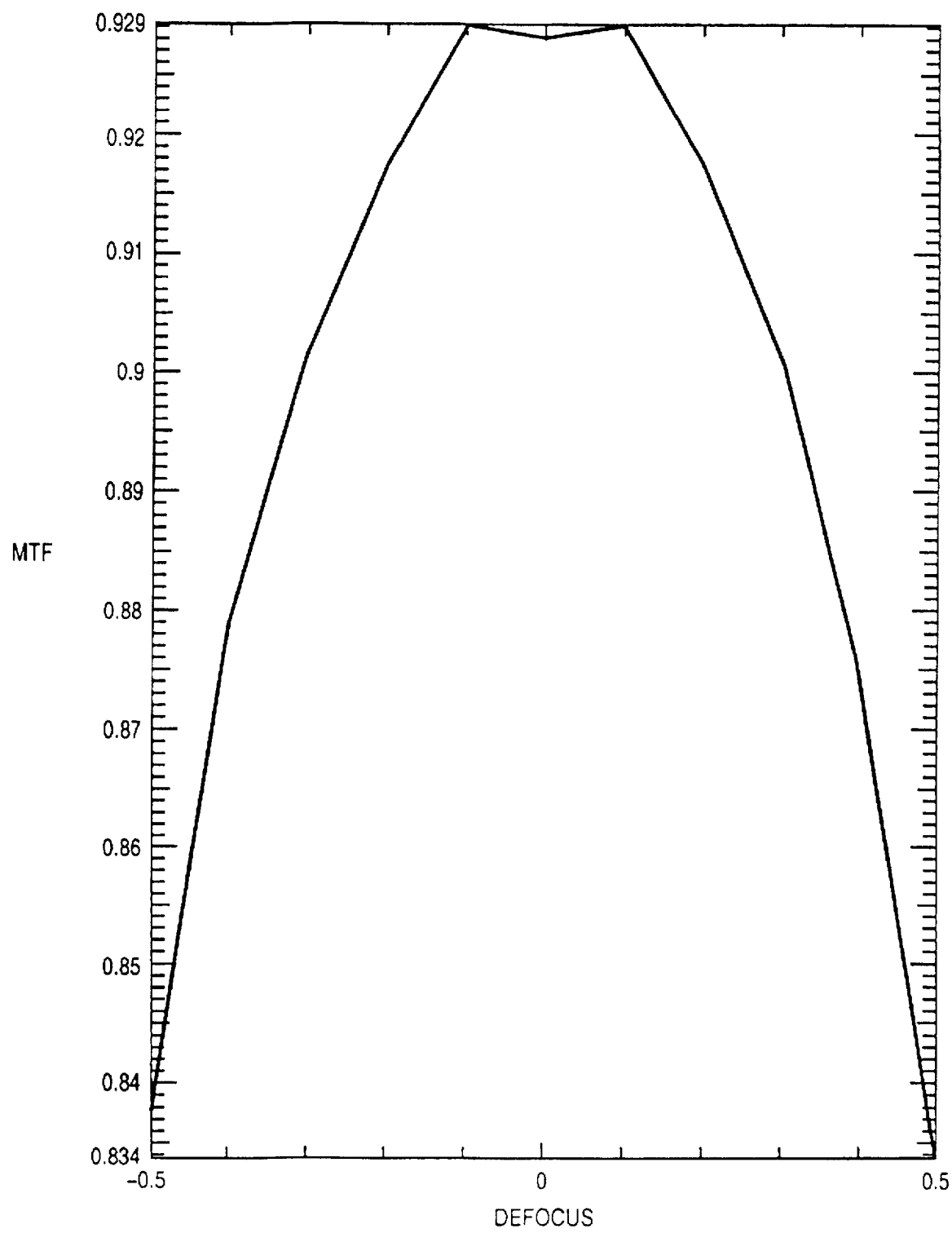
FIG_17

LAYOUT METHODOLOGY, MASK SET, AND PATTERNING METHOD FOR PHASE-SHIFTING LITHOGRAPHY

This is a divisional of application Ser. No. 08/413,405, filed Mar. 30, 1995, now U.S. Pat. No. 5,595,843.

BACKGROUND OF THE INVENTION

1. Field of the Invention

The present invention relates to the field of semiconductor device fabrication, and more specifically to a methodology for laying out a device layer, a mask set produced by the layout, and a method of patterning a photosensitive layer.

2. Background Information

In the semiconductor industry, there is a continuing effort to increase device density by scaling device size. In order to form small dimensioned features, a variety of phase-shifting techniques have been proposed. In some of these methods, features are defined by forming open regions in an opaque layer on a mask or reticle (referred to generally as "mask" herein). The open regions transmit substantially all radiation incident thereon. Near or surrounding these open regions are phase-shifters which also transmit some or all of the radiation incident thereon, but which shift the phase of the radiation approximately 180° relative to the openings forming the features. In this way, the radiation from the phase-shifter destructively interferes with the radiation from the feature, providing good contrast at the feature's edge.

A further method of using phase-shifting to form small features may be referred to as phase-edge phase-shifting. In this method, the destructive interference at the interface of two regions that transmit radiation approximately 180° out of phase is used to form the feature. This method is illustrated in FIG. 1. Mask 100 comprises a first region 101, which may be referred to as the 0° phase, and a second region 102, which may be referred to as the 180° phase. As shown, the second region 102 is adjacent to the first region 101 along interface 105.

Intensity curve 110 shows the intensity of radiation at the image plane, I, as a fraction of the intensity incident on the mask 100, $I_O$. As shown, the intensity 111 underneath region 101 away from the interface 105 is nearly equal to the intensity incident on region 101. Similarly, the intensity 112 underneath section 102 away from interface 105 is nearly equal to the intensity incident on region 102. However, underneath the interface 105 there is a sharp drop 115 in the intensity at the image plane due to the destructive interference between the radiation transmitted through regions 101 and 102. The exposure conditions can be adjusted such that the portion of the photosensitive layer underneath interface 105 is substantially unexposed, while portions of the photosensitive layer under regions 101 and 102 away from interface 105 are substantially exposed. In the case of a positive photoresist layer, after exposure and development, a thin line of photoresist will remain in the region underneath interface 105, while the remainder of the photoresist layer will be removed. In the case of a negative photoresist layer, after exposure and development, the unexposed region underneath interface 105 will be removed while photoresist under the remainder of the photosensitive layer will be hardened, and will remain after development. Thus, the phase-edge method may be used to form a narrow line in a positive photoresist layer, or a narrow opening in a negative photoresist layer.

One problem in implementing the phase-edge method is the difficulty in producing the device layer layout used to produce the masks used to define the device layer in the lithographic process. The phase-edge method typically requires at least two masks to implement. One mask, which may be referred to as the phase-edge mask, comprises phase-shifted regions to produce the small dimension lines described above. A second mask is used to eliminate unwanted lines produced from the phase-edge mask. The second mask may comprise device features defined by opaque and transparent regions on the mask. As will be described below, while there are known methods to produce a layout of the device features, there is no simple way to generate a layout of the phase-edge layer.

Referring to FIG. 2, a plan view of a portion of a device layer is shown. As can be seen, a plurality of features 201–205 are present. It will be appreciated that the features 201–205 are for illustration purposes, and the device layer may have many different features and/or the features may have different configurations, depending upon the device layer being formed. It will further be appreciated that there will typically be many more features in other regions of the device layer not shown.

To form the features of FIG. 2 using the phase-edge method, a mask such as that shown in FIG. 3 may be employed. As shown, the mask 300 comprises a plurality of 180° regions and a plurality of 0° regions. As described above, in the case of positive photoresist, a thin line will be formed at every interface.

Note that since the 0° regions and the 180° regions are two dimensional regions, it is not practical to form an isolated 0°/180° interface. That is, an isolated line cannot be formed by a mask such as mask 300 of FIG. 3, but rather loops or closed polygon structures are formed. Thus, as mentioned above, a second exposure must be performed to remove unwanted portions of the phase-edge layer. For example, a photoresist layer may be exposed to mask 300 and to a mask having features 201–205, etc., prior to development. The exposure to mask 300 will produce very small dimension lines, and the exposure to the second mask will eliminate unwanted portions. For example, a latent image corresponding to the interface 301 will be formed in the photosensitive layer due to exposure to mask 300, while portions 301a of the latent image will be exposed and therefore eliminated after exposure to the second mask. Thus, in a positive photosensitive layer, a thin line corresponding to interface 301, without sections 301a, will remain.

Many techniques are known for generating a layout such as that shown in FIG. 2. Typically, circuit requirements, and various design rules, are input into a design system which then creates a layout. For example, as is well known, device layers are typically laid out with reference to points of a pre-defined grid. The grid points may be spaced at, for example, 0.1μ. Features are defined in relation to the grid, by placing all vertices at some grid point. For example, referring to FIG. 2, corner 250 of feature 201 may be defined at a certain grid point. If feature 201 is to have a width of 0.6μ, corner 251 will be spaced six grid points to the right. Similarly, the other vertices points 252–255 will be placed at the appropriate grid points to give feature 201 the desired shape, width, and length. In placing features such as features 201–205, the program will take in to account the desired circuit, as well as various design rules. For example, features typically have minimum dimensions (for example, a design rule may be that a feature must be at least 0.6μ wide). In addition, the design rules include a minimum spacing requirement between any portion of the features. Also, the design rules typically specify a minimum pitch between features. For example, if the minimum pitch were 1.2μ, then a portion of, for example, feature 203 such as edge 203a must be at least 1.2μ from edge 204a of feature 204. In addition, there may be other design rules dictated by device or process requirements that must be obeyed by the program in creating the layout.

As mentioned above, methods of automatically producing a design layer layout wherein desired circuits, and design rules, are specified and a corresponding design is then automatically produced are well known in the art. The design system typically may have one or more compaction routines which shrink or otherwise optimize the layout. Although a device layer comprising features such as those shown in FIG. 2 may be generated automatically, it is not an easy task to generate the layout for mask 300. This is because existing systems have no way to convert existing rules, using existing systems, into a layout of regions such as that shown in FIG. 3. Further, the existing systems have no way to convert a layout for features such as those shown in FIG. 2 into a layout for a reticle 300 of FIG. 3 using existing rules and design systems. While a small portion, such as that shown in FIG. 3 may be drawn by hand, such would be an extremely difficult task for an entire chip, as many devices contain millions of transistors, and devices in the future can be expected to contain tens of millions of transistors.

The phase-edge technique has also been proposed to form contacts in a negative resist. In one method, a negative photosensitive layer is exposed to a first reticle having strips of alternating 0° and 180° regions to form a first set of phase-edges. Then, the photosensitive layer is exposed to a second reticle also having strips of alternating 0° and 180° regions, to form a second set of phase-edges which are arranged substantially orthogonal to those of the first reticle. After these two exposures, a small dimension latent image is formed at every intersection of the first and second sets of phase-edges. Finally, a third exposure is performed using a standard contact mask to expose those latent images where no contact is desired, and mask those where a contact opening is desired. However, as described above in relation to FIG. 2, it is difficult to produce automatically a layout of the masks using known layout techniques.

It should also be noted that at least one further photolithographic technique, referred to herein as the single-edge feature method has the same layout problem as described above for the phase-edge technique. In this method, a layer of, for example, oxide may be deposited on a substrate. The layer is patterned using a mask similar to mask 300 of FIG. 3, except that one of the 0° or 180° regions are replaced with opaque regions, while the other of the 0° and 180° regions remain transmitting. If desired, enhancement techniques such as phase-shifting may be used. After development of, e.g., a positive photosensitive layer, and etching of the oxide, oxide regions corresponding to the opaque regions remain. For example, referring to FIG. 4A, an oxide region 402 on a substrate 401 is shown. Next, a layer 403, such as polysilicon, is deposited. Following deposition of layer 403, an anisotropic etch is performed to leave structures similar to sidewall spacers along the edges of the region 402. The substrate after etch is shown in FIG. 4B. After removal of the oxide 402, the single edge features 403a remain, as shown in FIG. 4C. By use of this method, the single edge features 403a may have a dimension of approximately 0.1μ or less. This method may be used to form, for example, a polysilicon gate of a transistor. Since the single edge feature 403a is formed along all edges of oxide region 402, it has the loop like structure described above in connection with the phase-edge layer. Therefore, deposition of a further photosensitive layer, and exposure to a second mask (such as mask 200) is performed, followed by a polysilicon etch to remove unwanted portions of spacer 403a. The patterning and etch steps may be performed either before or after removal of the oxide layer 402. This method has the same problem as described for the phase-edge method, wherein it is extremely difficult to layout the layer which forms the regions 402.

What is needed is a method for producing a layout for the phase-edge technique, or for the single edge feature technique. The method should provide a circuit designer with an efficient way to automatically produce a layout from which the phase-edge layer and feature layer may be produced. Further, methods of patterning photoresist layers using masks designed according to the layout method are needed.

SUMMARY OF THE INVENTION

A method of producing a device layer layout is disclosed. A plurality of lines are defined, and the device features are placed on the lines. In this way, a phase-edge or single edge feature mask can be produced from the layout to pattern an image corresponding to the lines. A second mask having the device features overlying the lines is also produced from the layout and is used to preserve wanted portions of the image and to remove unwanted portions of the image.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1 illustrates the intensity profile obtained in the phase-edge technique.

FIG. 2 illustrates a portion of a prior art device layer.

FIG. 3 illustrates a portion of a phase-edge mask needed to pattern the features of FIG. 2.

FIGS. 4A, 4B, and 4C illustrate fabrication of a single edge feature.

FIG. 5 illustrates the layout of a portion of a device layer according to a currently preferred embodiment of the present invention.

FIG. 6 illustrates the phase-edge layer extracted from the layout shown in FIG. 5.

FIG. 7 illustrates a phase-edge mask fabricated according to the layout of FIG. 6.

FIG. 8 illustrates features formed according to the method of the present invention.

FIG. 9 illustrates use of the present invention to layout a contact/via opening layer.

FIG. 10 illustrates a first phase-edge layer obtained from the layout of FIG. 9.

FIG. 11 illustrates a second phase-edge layer obtained from the layout shown in FIG. 9.

FIG. 12 illustrates the latent image formed in a photosensitive layer after exposure to the masks shown in FIGS. 10 and 11.

FIG. 13 shows device features formed after exposure to the masks of FIG. 10, 11, and the contact layer.

FIGS. 14A–14D illustrate fabrication of contact plugs using the present invention.

FIG. 15 illustrates a plurality of aerial images at various defocus positions obtained with the contact/via plug lithography method of the present invention.

FIG. 16 illustrates a close-up view of a portion of the aerial images of FIG. 15.

FIG. 17 illustrates the modulation transfer function of the contact/via plugs of the present invention.

DETAILED DESCRIPTION

A device layout methodology and a method and apparatus for forming a device layer is disclosed. In the following description, numerous specific details are set forth such as specific materials, mask patterns, dimensions, process steps, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. In addition, although the present invention is described in conjunction with the phase-edge technique, it will be appreciated that the present invention may also be used in the practice of, for example, the single-edge feature technique.

For convenience, regions are nominally referred to as the 0° phase, or as the 180° phase, and regions may nominally be referred to as phase-shifted ±180° relative to each other. It will be appreciated that this nomenclature is not necessarily meant to indicate the actual phase of radiation transmitted through a region or the actual phase difference between two regions. It will also be appreciated that any nominal or actual phase of a region or phase difference between regions encompasses all 360° multiples of the phase or phase difference. It will further be appreciated that for the phase-shifted mask to be effective, the phase difference between a phase-shifting element and a proximate or adjacent opening does not need to be exactly 180° but may be anywhere between approximately 160°–200° (or 160°–200° plus a multiple of 360°).

In many instances, a phase difference as close as possible to 180° is desirable to maximize the destructive interference so that, referring to FIG. 1, the difference in intensity between the bottom of spike 115 and the levels 111/112 is maximized. In other cases, a phase difference other than 180° and even outside of the ranges given above may be sufficient. In general, any difference in phase creates a spike in intensity such as that shown in FIG. 1. In this regard, it will be appreciated that what is desired is that a portion of the photosensitive layer underneath an interface such as interface 105 of FIG. 1 is substantially unexposed, while portions of the photosensitive layer a distance from the interface are substantially exposed.

Whether the phase difference and resulting intensity profile are acceptable will depend upon the lithography process, materials, and process and device requirements. For example, a negative photosensitive layer is substantially exposed when the exposure is such that, upon development, a sufficient amount of the substantially exposed portion of the photosensitive layer remains for the purposes of the process in which the photosensitive layer is used. For a positive photosensitive layer, sufficient exposure is such that, upon development, the substantially exposed portion of the photosensitive layer is sufficiently removed for the purposes of the process in which the photosensitive layer is used. Similarly, a negative photosensitive layer is substantially unexposed when the exposure is such that the substantially unexposed portion of the photosensitive layer is sufficiently removed for the process in which the photosensitive layer is used. Finally, a positive photosensitive layer is substantially unexposed when the exposure is such that the substantially unexposed portion of the photosensitive layer remains in an amount sufficient for the process for which the photosensitive layer is used.

In the present specification, device features, or a portion of a device layer are illustrated in the accompanying drawings. As is well known, device features of a device layer exist as physical structures on a substrate. These device features on a substrate are formed using a mask having a corresponding pattern thereon. The pattern on the mask may be a negative or positive image of the device layer to be formed, and may be, for example, at some magnification, such as 5:1. Finally, a layout of the features of a device layer exist in the design system database, as is well known. Since the layout, features on the reticle, and features on the substrate correspond to one another, and are visually similar on a conceptual level, the same figure may be used interchangeably to illustrate the features on the substrate, and/or the features on the mask, and/or the features of the layer layout as is exists in the database, depending upon the context.

As described earlier, although the layout for conventional features may be produced automatically by specifying circuitry, and design rules, there is no simple way to automatically produce a layout for the phase-edge portion of a device layer. Therefore, in the present invention the conventional device features are laid out along lines. In general, in a preferred embodiment, the lines are substantially straight lines, which may be arranged such that some lines intersect others in, for example, a substantially orthogonal relationship. From the present specification it will be appreciated that other arrangements may be used, so long as the relationship between the lines and features is known, so that the layouts for masks may be produced as described herein. In the following description, the lines may be described as being in rows and columns, or as being horizontal or vertical. It will be appreciated that such nomenclature is for purposes of illustration and not meant to indicate any absolute orientation. Referring now to FIG. 5, the layout methodology of the present invention is illustrated. A plurality of vertical lines 520–527, and a plurality of horizontal lines 530 and 531 are defined. These lines may be predefined with respect to the grid system described earlier, or may be defined in conjunction with placement of the features. That is, as the design systems' program encounters a first feature, it defines a line with respect to that feature, and then defines subsequent lines with respect to this line, or with respect to subsequent features.

In one embodiment, the lines may be defined in a periodic manner as shown in FIG. 5 for lines 520–527, with each line spaced a distance equal to approximately the minimum pitch or greater. Alternatively, the lines may be placed irregularly or only where needed, as shown for lines 530 and 531. Any combination of periodic lines or irregularly placed lines may be used. For example, the lines may be periodic for a distance, and then skip a distance. The lines may be predefined, such that the system first defines the lines, and then places features on the pre-defined lines as the layer is created. Alternatively, the lines may be created as the device layer layout is created - i.e., lines are created as features are defined. In general, whether the lines are pre-defined or are defined as the system creates the layout, a series of lines should be placed at approximately the minimum pitch.

For example, referring again to FIG. 5, the lines 520–527, and 530–531 may be defined by the system before the features are laid out. Next, as the system creates the layout which is to have features similar to those shown in FIG. 2, for example, the features are placed along the lines 520–527. As can be seen, vertical segments of the features are placed along vertical lines, and horizontal segments are placed along horizontal lines. For example, segment 501 a of feature 501 is placed along vertical line 521, while horizontal segment 501 b is placed along horizontal line 530. Next, all other features are placed along one of the lines as each feature is defined by the design system.

In the case where the lines are defined as the layout is created, the system checks to see if there are lines nearby that have been defined during the placement of a previously defined feature. If so, a new feature is placed on the previously defined line. When the system defines a feature which is not on or near a line previously placed by the system, the system defines a new line and places the feature along that line. As described above, the line should be spaced apart from other lines at approximately the minimum pitch, or greater.

Thus, as the device layer is produced, all horizontal and vertical segments of all features fall on one of the lines. Referring briefly to FIG. 2, note that vertical segment of 201a of feature 201 is offset slightly from vertical segment 202a of feature 202. In the layout shown in FIG. 5, segment 202a would fall approximately between lines 521 and 522. In contrast, in the present invention, the program requires that segment 502a of feature 502 be on a line, such as line 521 as shown. Alternatively, it may be that feature 502 could be placed such that segment 502a is disposed on line 520 or 522, for example. The program may be designed to place a feature on the closest available line, or may have other criteria specified by the circuit design with regard to placement of features. Similarly, feature 506 has been placed such that vertical segment 506a is on line 526, i.e., in line with feature 505, and horizontal portion 506b is on line 531, i.e., lined up with horizontal section 502b of feature 502.

In the present invention the layout 500 of FIG. 5 is used to produce one or more phase-edge layers to produce thin lines as discussed generally herein. The layout 500 is also used to produce what will be referred to herein as the device feature layer. The device feature layer will contain the features, such as features 501–506 of FIG. 5, and is used to block wanted portions of the phase-edge lines from exposure, while exposing unwanted portions. In the present invention, the photosensitive layer will be exposed to the phase-edge layer or layers, and the device feature layer, to produce the final device layer. In general, the device feature layer of the present invention is similar to prior art device layers wherein a single exposure is used. It should be noted that in the present invention, a single photosensitive layer will be exposed multiple times with multiple masks. However, the order of exposure typically is not important. Therefore, reference to a first mask, second mask, etc., or first exposure, second exposure, etc. is not meant to indicate the order in which the exposure is performed or the mask is used.

Once the features have been placed on the lines as described above, the lines are extracted from the design system's database to produce the phase-edge layer layout 600 shown in FIG. 6. Then, the layout 600 is used to produce a mask such as mask 700 illustrated in FIG. 7. As shown in FIG. 7, each area bounded by the lines is designated as either a 0° region 701 or a 180° region 702. As described earlier, for the purposes of the present invention, the designation of one region as 0° and one region as 180° is arbitrary and may be reversed. As described in relation to FIG. 1, there will be a drop in intensity of radiation transmitted through mask 700 of FIG. 7 at every 0°/180° interface. After exposure to mask 700, a latent image corresponding to the grid shown in FIG. 6 will thus be formed in the photosensitive layer.

The photosensitive layer is additionally exposed to the device feature layer, that is, to a mask having features such as 501–506 of FIG. 5. After exposure to the above described masks, and development, the photosensitive layer will appear as shown in FIG. 8. As shown, the features 801–806 correspond generally to the features 501–506. However, because the width of each feature has been formed by use of phase-edge phase-shifting, it is of very small dimension. For example, the width of the lines of each of the features 801–806 may be well below 0.25μ depending upon the particular lithographic process.

Note that some of the features comprise cross members 825 which result from the fact that a crossing in the lines formed from mask 700 of FIG. 7 is covered by one of the features 501–506. The length of these cross members 825 will depend upon the width of the features 501–506. Typically, for various wiring structures such as interconnects, these cross members 825 will be of no consequence. In some structures, such as gates, it may not be desirable to have the cross members 825. As shown in FIG. 8, portions of the features may be without such cross members 825 by virtue of the placement of the lines. For example, referring back to FIG. 5, the lines 530 and 531 are disposed such that features 503–505 have no cross members 825, and such that features underneath the vertical portion 501a of feature 501,502a of feature 502, and 506a of feature 506 have no cross members. That is, in laying out the circuit, regions can be reserved where gates are to be present such that no crossing lines exist. Even in embodiments where periodic horizontal and vertical lines are used, the spacing of the lines, and the geometry and dimensions of the diffusion regions may be such that no cross members 825 are present on gate portions of the features.

Note that the present invention is not restricted to use of a positive photosensitive layer as described above to form gates, interconnects, or other structures. In addition, the present invention may be utilized with a negative photosensitive layer. For example, exposure to mask 700 of FIG. 7, followed by exposure to mask 500 of FIG. 5, and then development, results in trenches or channels being formed in the photosensitive layer. This may be used as an etch mask to form, for example, channels in an underlying layer, such as a underlying dielectric layer, into which a conductive material may be deposited to form interconnects.

With regard to an embodiment used to form single edge features, one of the regions 701 and 702 of mask 700 of FIG. 7 is opaque, while the other one of the regions 701 and 702 is transmitting, depending upon whether a positive photosensitive layer or a negative photosensitive layer is used, and depending upon which areas it is desired to build sidewall structures upon to form device features.

The present invention may be used to produce a layout to form small dimension openings in a photosensitive layer, which may be used to form, for example, contact or via openings. Referring to FIG. 9, a plurality of contact openings 901 are defined on the intersection of the plurality of vertical lines 920–927, and horizontal lines 930–936. As described earlier, the lines may be pre-defined or may be defined as the contacts are defined. In addition, the lines need not necessarily be periodic and need not necessarily be orthogonal as shown. In the embodiment shown herein, note that the contacts are defined over intersections of the lines. As will be seen, this ensures that the phase-edge layers and device feature layer may automatically be extracted from the database to produce the appropriate masks. Generally, it may be possible to use the same lines as those used for the layer to which contact is being made. Some additional lines may need to be defined in the contact layer to produce intersections at each contact opening, where, for example, a contact overlies a portion of an underlying line not at an intersection. For example, referring back to FIG. 5, if it were desired to contact line 503, it would be necessary to add a line intersecting line 524 at some point along line 524 where feature 503 is present to produce an intersection. Furthermore, the contact layer need not necessarily have all the lines of the underlying layer, as the underlying layer typically has a greater density of features than the contact layer.

After the features 901 have been placed on the lines 920–927, and 930–936, the vertical lines 920–927 are extracted to create mask 1000 of FIG. 10 having alternating 0° regions and 180° regions defined by the lines 920–927. Also, as shown in FIG. 11, the horizontal lines 930–936 are extracted to create a mask 1100, also having alternating regions of 0°, and 180° defined by the lines 930–936.

To create contact openings, a negative photosensitive layer is exposed to mask 1000 at approximately 50% or more of the typical dose needed for a contact opening. Similarly, the photosensitive layer is exposed to mask 1100 at approximately 50% or more of the exposure needed for contact patterning in the lithographic process being used. Typically, one half the dose used in a standard contact opening process - i.e., a single exposure to a mask having features 901, is sufficient to substantially expose open field regions. If desired, more than this amount may be used. Use of approximately one half the dose of the standard contact opening process dose, as opposed to greater dosage, helps prevent overexposure of the contact openings. One of skill in the art may readily determine the appropriate dose to ensure that the horizontal lines, other than at the intersections, are substantially exposed during the exposure to the vertical lines, and vice versa, without overexposing the intersections.

After exposure to the masks 1000 and 1100, portions of the photosensitive layer not under either the vertical or horizontal lines, have received two exposures. Portions of the photosensitive layer under either the vertical or horizontal lines, but not at an intersection thereof, have received a single exposure, which, as described above, is sufficient to substantially expose the photosensitive layer. Therefore, after these exposures, a latent image at each of the intersections is created as shown in FIG. 12. In FIG. 12, each of the latent images 1201 has a dimension of less than 0.25µ in a preferred embodiment. Of course, the dimension will depend upon the lithographic process. In FIG. 12, only some of the latent images 1201 are labeled. However, it will be understood that after exposure to mask 1000 and mask 1100, there will be a latent image at every intersection.

Next, the photosensitive layer is exposed to a mask having the features 901 disposed at those intersections where contact openings are desired. After this exposure and development, contact openings will be present as shown in FIG. 12, as all other regions of the photoresist layer are substantially exposed in one or more of the above-described three exposures. Again, it will be appreciated that the masks 1000, 1100, and the mask having the features 901 may be exposed in any order. As shown in FIG. 13, a plurality of contact openings 1301 are formed in the photosensitive layer in the regions underneath the features 901. Again, only some of the contact openings 1301 are labeled for clarity.

The present invention may be used to form contact or via plugs using positive photoresist. The positive photosensitive layer is exposed to three masks and then developed substantially as described in relation to FIGS. 9–13. In the case of a positive photosensitive layer, the features 1301 of FIG. 13 will now be columns or pillars of resist. For example, FIG. 14A shows a side view of a plurality of pillars 1401. The pillars 1401 are formed on conductive layer 1405 which is deposited on substrate 1400. Following formation of pillars 1401, an etch is performed on layer 1405 during which portions of layer 1405 are masked by the resist pillars 1401. The etch is followed by removal of the photosensitive pillars 1401. The resulting structure is shown in FIG. 14B where plugs 1406 of conductive material have been formed from layer 1405. Next, as shown in FIG. 14C dielectric layer 1410 is deposited on the substrate. Next, a thickness of dielectric layer 1410 is removed to expose the plugs 1406, as shown in FIG. 14D. The layer 1410 after removal of the upper portion is shown as layer 1410a. The process to remove a thickness of layer 1410 to produce layer 1410a exposing the plugs 1406 may be any well known process such as a damascene process.

In the above-described embodiment for forming small openings or resist pillars, two phase-edge layers were used to reduce the dimensioning of the opening or plug. Alternatively, if desired, the phase-edge masking may be performed in a single step with a checkerboard-like structure. However, this embodiment has a disadvantage that cross-like structures will be formed. These cross-like structures will have a larger dimension than the above-described embodiment, wherein the entire photosensitive layer, except at the intersection of the lines, is exposed. FIG. 15 shows intensity profiles (aerial images) of two dark images (e.g., two of the latent images 1201 of FIG. 12, or 1301 of FIG. 13) spaced a distance 0.5µapart. In FIG. 15, a plurality of these aerial images, at several defocus positions from −0.5µ−+0.5µ are superimposed. The drops in intensity 1501 correspond to the above described intersection of the vertical and horizontal phase-edges.

Referring now to FIG. 16, a close up of one of the images 1501 is shown. The conjugate isofocal plane, which is the position on the aerial image where the image size is the same regardless of defocus, is shown at position 1605. The feature size is less than 0.1µ at the conjugate isofocal plane, indicating that sub-quarter micron features with very good process latitude may be formed by the present invention. Referring now to FIG. 17, the modulation transfer function (MTF) of the images is shown. Note that even at defocus of +/±0.5µ, the MTF is greater than 0.8, indicating good contrast. The aerial images of FIGS. 15 and 16, and the MTF's of FIG. 17 were produced using an exposure wavelength of 193 nm, a numerical aperture (NA) of 0.6, and a partial coherence of 0.4. In contrast to the present invention, aerial images for 0.1µ resist pillars using a conventional mask with opaque features to form the resist pillars, show that the MTF for the prior art process is below 0.35 even at best focus.

As described herein, the present invention comprises defining a plurality of lines which, depending upon the features, may be arranged in rows and/or columns. The definition of the lines may be done in a variety of manners. In one embodiment, lines may be pre-defined with respect to the earlier described grid points in relation to which features are typically defined. For example, in one embodiment the lines may be laid out in rows and columns spaced at approximately the minimum pitch. Features can then be placed on these lines as they are encountered by the system. Alternatively, lines can be defined as features are created. In this embodiment, it should be ensured that no two lines are spaced closer than approximately the minimum pitch, although lines may be placed apart greater than the minimum.

In any embodiment, it may desirable to skip definition of lines where no patterns exist. For example, referring back to FIG. 5, lines 522 and 523 may be skipped, assuming there are no features above or below the portion of the layout 500 shown in FIG. 5. More typically, device patterns may contain regions where numerous features are present, and other regions where few features are present. In this case, even if it is not efficient to skip writing lines in small regions such as where lines 522 and 523 are present, it may be advantageous to skip writing lines in other portions of the device layer. In addition, it will be appreciated that devices are often broken down into functional units, and the units may further be broken down into various subunits. Each unit or subunit need not follow the same system of lines. Rather, each unit or subunit can follow its own system as appropriate. Often, various units, or subunits repeat, so that once the lines for such a unit or subunit are defined, the layout can simply be repeated for all the repeating units, subunits, etc. It should be noted that in embodiments where a single system of lines are not used for an entire chip, but rather portions such as the above described units or subunits may have their own system of lines, it may be necessary to further specify that no line is placed closer to the edge of a unit or subunit than approximately half the minimum pitch. Alternatively, when units or subunits are assembled together, the design system can check to ensure no two lines are closer than approximately the minimum pitch, and adjust as necessary. In this way, a line from a particular unit, and another line from an adjacent unit, are no closer together than approximately the minimum pitch.

In the present invention, since all features are disposed on one or more lines which are then extracted to form the phase-edge mask, the layout problem of defining the phase-edge mask for randomly placed features is avoided. It should be noted that the present invention has been shown and described in conjunction with features being placed approximately along the center of the lines. It will be appreciated that in defining the device layer layout, the features may be defined in relation to the lines with an offset, for example. Then, when the various portions are extracted to form masks, the lines and/or the features may be shifted, so that upon exposure the features cover the lines as described herein. The offset need not be the same for every line. Further, it will be appreciated that use of one or more mathematical rules or design constraints for placement of the features as described herein, and use of the rules to extract the phase-edge layer, is within the scope of defining lines and placing features in a known relationship to the lines, even if no actual lines are created in the design system database.

As described above, the lines of the present invention should be spaced no more closely than approximately the minimum allowable pitch, features should be placed no closer than the minimum spacing, and feature size should be no smaller than the minimum dimension. However, since the purpose of the device feature layer in the present invention is merely to block some portions of the phase-edge layer from exposure, causing other portions to be exposed, the minimum pitch, spacing, or dimension for purposes of the present invention may be a smaller than the corresponding minimum for a device layer used alone, and may in essence be dictated by the phase-edge layer lithography. That is, in the prior art, a mask having device features is the sole mask used to define the device features so that the minimum pitch, minimum spacing, and minimum dimension requirements must be adhered to. For example, in the prior art, if features are spaced too closely together, there may be bridging between the features. Typically, this may not be overcome by, for example, increasing the exposure as this may cause other problems, such as blurring of the feature edges or loss of linewidth control. In the present invention, since the phase-shift edges are disposed some distance from the edge of the device layer features, it may be possible to, for example, decrease the pitch and spacing by making some adjustment to the lithographic process, such as increasing the exposure dose, to prevent bridging. For example, referring back to FIG. 5, if line 503 were made to extend such that the end of line 503 were closer to feature 502 than the minimum spacing, it may be possible to prevent bridging by adjusting e.g., the exposure. Because the linewidth of feature 503 is determined by the phase-edge produced from line 524, overexposure to a having feature 503 would have no appreciable affect on the linewidth, although the length may be affected slightly.

Thus, a layout methodology and a method and apparatus for patterning a device layer have been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of patterning a photosensitive layer comprising the steps of:

providing said photosensitive layer on a substrate;

exposing said photosensitive layer to a first mask having a pattern of first regions and second regions, said first regions and said second regions transmitting at least a portion of radiation incident thereon, said first regions phase-shifting radiation transmitted therethrough with respect to radiation transmitted through said second regions, said pattern arranged to produce a plurality of substantially unexposed lines in said photosensitive layer;

exposing said photosensitive layer to a second mask comprising a plurality of device features, each of said plurality of device features overlying at least a portion of one of said lines;

wherein said first mask and said second mask are produced from a device layer layout produced by a method comprising the steps of:

defining said plurality of lines;

defining said plurality of device features, wherein said features on said second mask comprise segments extending in a first and a second direction; and, placing each of said plurality of device features in a known relationship with respect to one of said lines.

2. The method as described in claim 1 wherein said pattern of said first regions and said second regions are arranged in rows and columns, each of said segments extending in said first direction overlying one of said lines arranged in said rows, and each of said segments extending in said second direction overlying one of said lines arranged in said columns.

3. The method as described in claim 2 wherein said photosensitive layer comprises a positive photosensitive layer, said method producing photosensitive members having a shape corresponding to said plurality of features and having a linewidth produced by said substantially unexposed lines.

4. The method as described in claim 2 wherein said photosensitive layer comprises a negative photosensitive layer, said method producing trenches in said photosensitive layer having a shape corresponding to said features and having a linewidth produced by said substantially unexposed lines.

5. The method as described in claim 1 wherein said lines of said layout are arranged in a plurality of rows and a plurality of columns, wherein said plurality of rows are used to produce said first mask having said first regions and second regions arranged such that said plurality of unexposed lines are substantially arranged in said rows, said method comprising exposing said photosensitive layer to a third mask, said third mask produced from said columns, said third mask comprising a pattern of third regions and fourth regions, said third regions and said fourth regions transmitting at least a portion of radiation incident thereon, said third regions phase-shifting radiation transmitted therethrough relative to radiation transmitted through said fourth regions, said pattern of said third regions and said fourth regions arranged to produce a plurality of substantially unexposed second lines in said photosensitive layer, said substantially unexposed second lines arranged in said columns, said first mask and said second mask having an aligned position such that said rows and said columns have intersections thereof, wherein said second mask has an aligned position with respect to said first and said third mask such that said features are disposed over said intersections.

6. The method as described in claim 5 wherein said photosensitive layer comprises a negative photosensitive layer, and wherein said features comprise contact or via openings.

7. The method as described in claim 5 wherein said photosensitive layer comprises a positive photosensitive layer, and wherein said method further comprises steps of:
providing a conductive layer on said substrate prior to said step of providing said photosensitive layer;
developing said photosensitive layer subsequent to said steps of exposing said photosensitive layer to said first, said second, and said third masks, to form a developed photosensitive layer exposing first regions of said conductive layer and masking second regions of said conductive layer; and
removing first portions of said conductive layer from said first regions, while leaving second portions of said conductive layer in said second regions.

8. The method as described in claim 7 further comprising depositing a dielectric layer over and around said second portions of said conductive layer.

9. The method as described in claim 8 wherein said dielectric layer is deposited to a thickness such that said second portions are covered by said dielectric layer, said process further comprising removing a portion of said dielectric layer to expose an upper region of said second portions of said conductive layer.

10. The method as described in claim 1 wherein said photosensitive layer comprises a positive photosensitive layer, said method producing photosensitive members having a shape corresponding to said plurality of features and having a linewidth produced by said substantially unexposed lines.

11. The method as described in claim 1 wherein said photosensitive layer comprises a negative photosensitive layer, said method producing trenches in said photosensitive layer having a shape corresponding to said features and having a linewidth produced by said substantially unexposed lines.

* * * * *

UNITED STATES PATENT AND TRADEMARK OFFICE
CERTIFICATE OF CORRECTION

PATENT NO. : 5,635,316
DATED : June 3, 1997
INVENTOR(S) : Giang T. Dao

It is certified that error appears in the above-indentified patent and that said Letters Patent is hereby corrected as shown below:

In column 12 at line 18 insert --mask-- following "a" and prior to "having"

Signed and Sealed this

Seventh Day of October, 1997

Attest:

BRUCE LEHMAN

Attesting Officer

Commissioner of Patents and Trademarks